United States Patent [19]

Danilatos

[11] Patent Number: 4,992,662

[45] Date of Patent: Feb. 12, 1991

[54] MULTIPURPOSE GASEOUS DETECTOR DEVICE FOR ELECTRON MICROSCOPE

[75] Inventor: Gerasimos D. Danilatos, North Bondi, Australia

[73] Assignee: ElectroScan Corporation, Wilmington, Mass.

[21] Appl. No.: 406,193

[22] Filed: Sep. 13, 1989

Related U.S. Application Data

[63] Continuation of Ser. No. 79,634, Jul. 30, 1987, abandoned.

[30] Foreign Application Priority Data

Aug. 1, 1986 [AU] Australia .......................... PH 07221

[51] Int. Cl.$^5$ ........................................ H01J 37/244
[52] U.S. Cl. .................................. 250/310; 250/306; 250/307
[58] Field of Search ........... 250/310, 307, 311, 423 R, 250/306, 309

[56] References Cited

U.S. PATENT DOCUMENTS

| | | | |
|---|---|---|---|
| 3,842,271 | 10/1974 | Gee et al. ............................ | 250/310 |
| 3,909,612 | 9/1975 | Gibbard ............................... | 250/310 |
| 3,984,683 | 10/1976 | Larach ................................ | 250/310 |
| 4,139,773 | 2/1979 | Swanson ........................ | 250/423 R |
| 4,249,077 | 2/1981 | Crawford ............................ | 250/310 |
| 4,365,339 | 12/1982 | Pavkovich et al. .................. | 378/15 |
| 4,712,057 | 12/1987 | Pau ..................................... | 250/311 |
| 4,720,633 | 1/1988 | Nelson ................................ | 250/310 |
| 4,785,182 | 11/1988 | Mancuso et al. .................... | 250/307 |

OTHER PUBLICATIONS

Danilatos, "A Gaseous Detector Device for an Environmental SEM", Micron and Microscopa Acta 14 (4), pp. 307–318 (1983).

Danilatos, "Design and Construction of an Atmospheric or Environmental SEM"(Part 3), Scanning, vol. 7, 26–42 (1985).

Danilatos, G. D., "Improvements on the Gaseous Detector Device", G.D. Bailey, Ed., Electron Microscopy Society of America, pp. 630–631 (1986).

Danilatos, G.D., "ESEM—A Multipurpose Surface Electron Microscope", G.W. Bailey Ed., Proceedings of the 44th Annual Meeting of the Electron Microscopy Society of America, pp. 632–633 (1986).

*Primary Examiner*—Jack I. Berman
*Assistant Examiner*—Kiet T. Nguyen
*Attorney, Agent, or Firm*—Curtis, Morris & Safford

[57] ABSTRACT

The invention provides for a scanning electron microscope which detects photons produced by contact between radiation emitted from the surface of a sample and gas molecules of a gaseous medium which surrounds the sample. The invention also provides a method for microscopically imaging the surface of a sample through the use of gaseous photon detection.

24 Claims, 1 Drawing Sheet

4,992,662

MULTIPURPOSE GASEOUS DETECTOR DEVICE FOR ELECTRON MICROSCOPE

This application is a continuation of application Ser. No. 07/079,634, filed July 30, 1987, now abandoned.

BACKGROUND OF THE INVENTION

Scanning electron microscopes and generally instruments employing an electron beam (probe) operate in vacuum (pressure less than about 0.0001 mbar) and the specimens examined by such instruments are also placed in vacuum. Scanning a sample within a vacuum presents many problems. Many biological specimens cannot survive in vacuum. Wet specimens can experience evaporation of their fluid content before an accurate image can be obtained. Nonconducting samples can accumulate a surface charge which obscures the details of the sample's surface and lowers the resolution of the image obtained.

An environmental scanning electron microscope (ESEM) which allows the examination of specimens in a gaseous environment is described in U.S. Pat. No. 4,596,928. The purpose of the gas in the '928 patent was to act as a conditioning medium in order to maintain a specimen in a liquid, set or natural state. However, the predominant detection mode in the ESEM has utilized various scintillator detectors to detect backscattered electrons. Additionally, an ESEM detection system has been described wherein the ionization of the gaseous environment is used as the detection means for all ionizing signals (Danilatos, Micron. Microsc. Acta 14:307–318, 1983).

OBJECTS OF THE INVENTION

An object of the present invention is to provide a more general and multipurpose means for environmental scanning electron microscopy.

It is also an object of the present invention to provide means for the detection in general of all signals which can react with a gas or mixture of gases inside an environmental electron microscope such that the gas itself acts as a detector.

SUMMARY OF THE INVENTION

The present invention provides a scanning electron microscope for cathodeluminescence detection of specimens which comprises a vacuum envelope having a pressure limiting aperture. An electron beam source is located within the vacuum envelope and is capable of emitting an electron beam. Focusing means are located within the vacuum envelope and are capable of directing an electron beam emitted by the electron beam source through the pressure limiting aperture. Electron beam scanning means are also located within the vacuum envelope and are capable of scanning an electron beam emitted by the electron beam source across the diameter of the pressure limiting aperture. A sample platform means is disposed outside the vacuum envelope and is capable of maintaining a sample in registration with the pressure limiting aperture such that a surface of the sample may be exposed to an electron beam emitted from the electron beam source and directed through the pressure limiting aperture so as to cause radiation to be emitted from the sample. The scanning electron microscope of the present invention further comprises gas containment means capable of maintaining the sample platform means enveloped in a gaseous medium so as to allow radiation emitted from a sample located on the sample platform means and exposed to an electron beam emitted from the electron beam source to come into contact with gas molecules of the gaseous medium and cause the gas molecules to emit photons. Detection means are provided which are capable of detecting photons emitted from the gas molecules of the gaseous medium.

The present invention also provides a method for microscopically imaging the surface of a sample which comprises surrounding the sample with gas molecules and scanning the surface of the sample with an electron beam having sufficient energy so as to cause radiation to be emitted from the surface of the sample. Photons which are emitted from the gas molecules which come into contact with radiation emitted from the surface of the sample are then detected, the photons being emitted from the gas molecules in an amount proportional to the amount of radiation emitted from the surface of the sample. Images of the sample are then formed based on the number of photons detected.

DETAILED DESCRIPTION OF THE INVENTION

Figure 1:
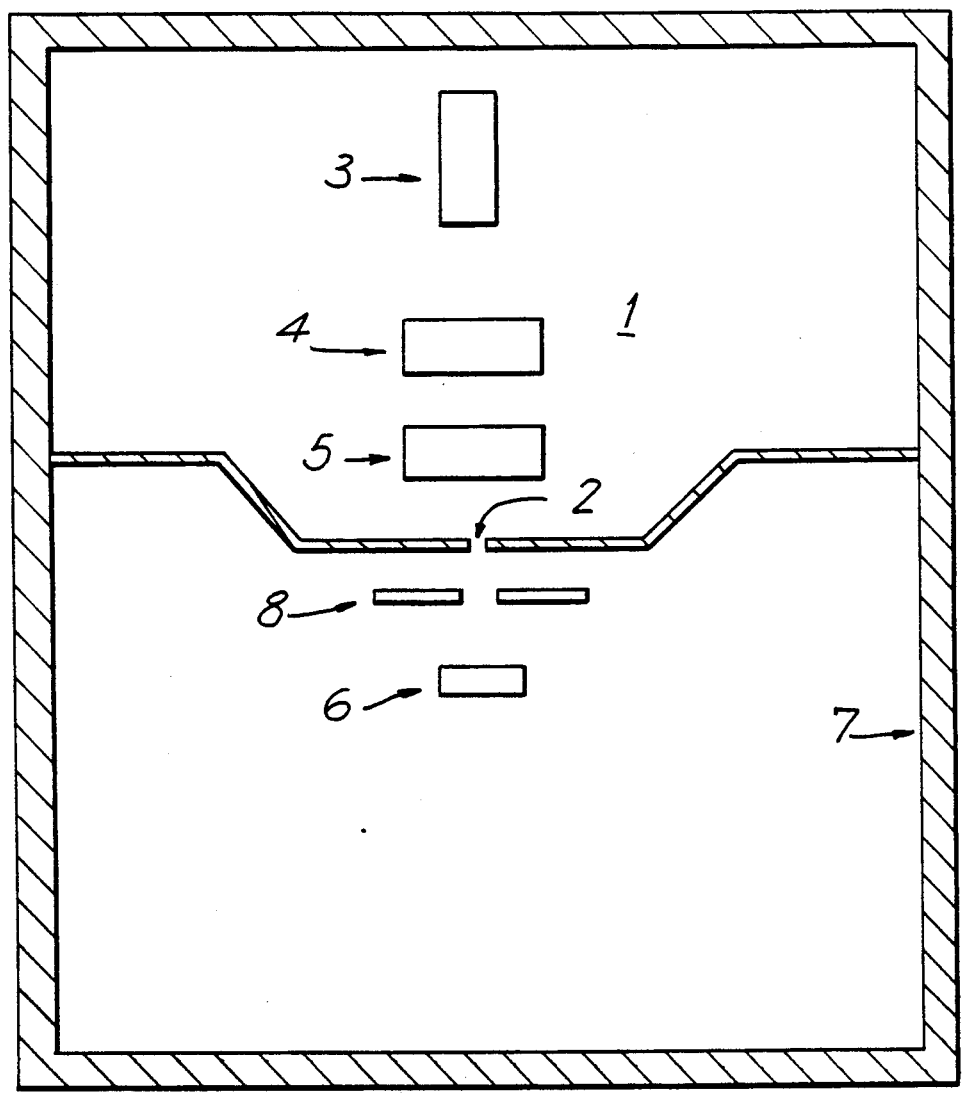
FIG. 1 is a schematic cross-sectional view of a device which embodies the present invention in a particular form.

The present invention provides a scanning electron microscope. Referring in more particularity to FIG. 1, the invention comprises a vacuum envelope 1 having a pressure limiting aperture 2. An electron beam source 3 is located within the vacuum envelope and is capable of emitting an electron beam. Focusing means 4 are located within the vacuum envelope and are capable of directing an electron beam emitted by the electron beam source through the pressure limiting aperture. Electron beam scanning means 5 are also located within the vacuum envelope and are capable of scanning an electron beam emitted by the electron beam source across the diameter of the pressure limiting aperture. A sample platform means 6 is disposed outside the vacuum envelope and is capable of maintaining a sample in registration with the pressure limiting aperture such that a surface of the sample may be exposed to an electron beam emitted from the electron beam source and directed through the pressure limiting aperture so as to cause radiation to be emitted from the sample. Within this application, "radiation" emitted from a sample means electrons or photons emitted from the sample.

The scanning electron microscope of the present invention further comprises a gas containment means 7 capable of maintaining the sample platform means enveloped in a gaseous medium so as to allow radiation emitted from a sample located on the sample platform means and exposed to an electron beam emitted from the electron beam source to come into contact with gas molecules of the gaseous medium and cause the gas molecules to emit photons. Detection means 8 are provided which are capable of detecting photons emitted from the gas molecules of the gaseous medium.

In one embodiment of the invention, the wavelength of the photons is within the range from about $1 \times 10^{-11}$ meters to about $4 \times 10^{-8}$ meters. Preferably within this embodiment of the invention the detection means is a scintillation counter or a lithium drifted silicon detector.

In another embodiment of the invention, the wavelength of the photons is within the range from about $4 \times 10^{-8}$ meters to about $7 \times 10^{-7}$ meters. Preferably within this embodiment of the invention the detection means is a photomultiplier tube or a photodiode.

In yet another embodiment of the invention, the wavelength of the photons is within the range from about $7 \times 10^{-7}$ meters to about $2 \times 10^{-4}$ meters. Preferably within this embodiment of the invention the detection means is a photomultiplier tube or a photodiode.

The gaseous medium may comprise a single gas or a mixture of gases. In one embodiment of the invention the gaseous medium comprises nitrogen. In another embodiment of the invention the gaseous medium comprises helium.

The present invention also provides a method for microscopically imaging the surface of a sample which comprises surrounding the sample with gas molecules and scanning the surface of the sample with an electron beam having sufficient energy so as to cause radiation to be emitted from the surface of the sample. Photons which are emitted from gas molecules which come into contact with radiation emitted from the surface of the sample are then detected, the photons being emitted from the gas in an amount proportional to the amount of radiation emitted from the surface of the sample. Images of the sample are then formed based on the number of photons detected.

In one embodiment of the invention, the wavelength of the photons is within the range from about $1 \times 10^{-11}$ meters to about $4 \times 10^{-8}$ meters. Preferably within this embodiment of the invention the detection means is a scintillation counter or a lithium drifted silicon detector.

In another embodiment of the invention, the wavelength of the photons is within the range from about $4 \times 10^{-8}$ meters to about $7 \times 10^{-7}$ meters. Preferably within this embodiment of the invention the detection means is a photomultiplier tube or a photodiode.

In yet a further embodiment of the invention, the wavelength of the photons is within the range from about $7 \times 10^{-7}$ meters to about $2 \times 10^{-4}$ meters. Preferably within this embodiment of the invention the detection means is a photomultiplier tube or a photodiode.

The gaseous medium may comprise a single gas or a mixture of gases. In one embodiment of the invention, the gaseous medium comprises nitrogen. In yet another embodiment of the invention, the gaseous medium comprises helium.

The gas utilized in the present invention is the primary medium, or the first and basic stage in the detention chain of the environmental scanning electron microscope. Additionally, the electron beam-specimen interactions generate signals which, in turn, react with the gas. The signal-gas interactions constitute the basis for the detection of signals. Some examples of signal-gas interactions are: gaseous scintillation, ionization, chemical combination, chemical disassociation, electron attachment, photo-ionization, X-ray reactions, rotational and vibrational collisions, collisions characterized by a particular energy loss, etc.

This multi-purpose gaseous detector device has many advantages over conventional detectors which can operate only in a vacuum. The present invention provides for the use of the gaseous environment of the specimen chamber of the environmental scanning electron microscope as a multi-purpose detector for the detection of high and low energy electrons, for the detection of photons, including X-rays and detection of other products from chemical reactions. The present device allows for the examination of specimens in air. It generates new information on specimens in air not possible in the previous art of detection. It is more general and multi-purpose than previously known in the art of environmental scanning electron microscopes and atmospheric scanning electron microscopes.

Although the present invention has been described in connection with various preferred embodiments thereof, it will be apparent to one of ordinary skill in the art that many changes and modifications may be made therein without departing from the spirit and scope of the present invention, which is determined by reference to the appended claims.

What is claimed is:

1. A scanning electron microscope which comprises:
   (a) a vacuum envelope having a pressure limiting aperture;
   (b) an electron beam source located within the vacuum envelope for emitting an electron beam;
   (c) focusing means located within the vacuum envelope for directing an electron beam emitted by the electron beam source through the pressure limiting aperture;
   (d) electron beam scanning means located within the vacuum envelope for scanning an electron beam emitted by the electron beam source across the diameter of the pressure limiting aperture;
   (e) sample platform means, disposed outside the vacuum envelope, for maintaining a sample in registration with the pressure limiting aperture such that a surface of the sample is exposed to an electron beam emitted from the electron beam source and directed through the pressure limiting aperture so as to cause a plurality of signals of different character to be emitted from the sample;
   (f) gas containment means for maintaining the sample platform means enveloped in a gaseous medium so as to allow said plurality of signals of different character emitted from the sample located on the sample platform means and exposed to an electron beam emitted from the electron beam source to come into contact with gas molecules of the gaseous medium and cause the signal-gas interacting produce a plurality of products; and
   (g) said gaseous medium providing for a detector means for the detection of the plurality of signals of different character emitted from the surface of the sample to produce image signals.

2. A device of claim 1 wherein said gaseous medium is such that the wavelength of the photons is within the range from about $4 \times 10^{-18}$ meters to about $7 \times 10^{-7}$ meters.

3. A device of claim 2 wherein the detection means is a photomultiplier tube.

4. A device of claim 2 wherein the detection means is a photodiode.

5. A device of claim 1 wherein said gaseous medium is such that the wavelength of the photons is within the range from about $7 \times 10^{-7}$ meters to about $2 \times 10^{-4}$ meters.

6. A device of claim 5 wherein the detection means is a photomultiplier tube.

7. A device of claim 5 wherein the detection means is a photodiode.

8. A device of claim 1 wherein the gaseous medium comprises a single gas.

9. A device of claim 1 wherein the gaseous medium comprises a mixture of gases.

10. A device of claim 1 wherein the gaseous medium comprises nitrogen.

11. A device of claim 1 wherein the gaseous medium comprises helium.

12. The scanning electron microscope of claim 1 wherein one of the signals emitted from the surface of the sample is photons.

13. A device of claim 12 wherein said gaseous medium is such that the wavelength of the photons is within the range from about $1 \times 10^{-11}$ meters to about $4 \times 10^{-8}$ meters.

14. A device of claim 2 wherein the detection means is a scintillation counter.

15. A device of claim 2 wherein the detection means is a lithium drifted silicon detector.

16. A method for microscopically imaging the surface of a sample which comprises:
   (a) surrounding the sample with gas molecules;
   (b) scanning the surface of the sample with an electron beam having sufficient energy so as to cause a plurality of signals of different character to be emitted from the surface of the sample;
   (c) interacting said plurality of signals of different character with gas molecules to produce a plurality of products;
   (d) utilizing the gas molecules to detect said a plurality of signals of different character emitted from the surface of the sample; and
   (e) forming images of the sample based on the signals detected.

17. A method of claim 16 wherein the gaseous medium comprises a single gas.

18. A method of claim 16 wherein the gaseous medium comprises a mixture of gases.

19. A method of claim 16 wherein the gaseous medium comprises nitrogen.

20. A method of claim 16 wherein the gaseous medium comprises helium.

21. The method for microscopically imaging the surface of a sample of claim 15 wherein one of the signals emitted from the surface of the sample is photons.

22. A method of claim 21 wherein said gaseous medium is such that the wavelength of the photons is within the range from about $1 \times 10^{-11}$ meters to about $4 \times 10^{-8}$ meters.

23. A method of claim 21 wherein said gaseous medium is such that he wavelength of the photons is within the range from about $4 \times 10^{-8}$ meters to about $7 \times 10^{-7}$ meters.

24. A method of claim 21 wherein said gaseous medium is such that the wavelength of the photons is within the range from about $7 \times 10^{-7}$ meters to about $2 \times 10^{-4}$ meters.

* * * * *

UNITED STATES PATENT AND TRADEMARK OFFICE
CERTIFICATE OF CORRECTION

PATENT NO. : 4,992,662
DATED : Feb. 12, 1991
INVENTOR(S) : Gerasimos D. Danilatos It is certified that error appears in the above-identified patent and that said Letters Patent is hereby corrected as shown below:

In columns 4, 5, and 6, claims 1-16 and 21, should be corrected to read as follows:

-- 1. A scanning electron microscope which comprises:

(a) a vacuum envelope having a pressure limiting aperture;

(b) an electron beam source located within the vacuum envelope for emitting an electron beam;

(c) focusing means located within the vacuum envelope for directing an electron beam emitted by the electron beam source through the pressure limiting aperture;

(d) electron beam scanning means located within the vacuum envelope for scanning an electron beam emitted by the electron beam source across the diameter of the pressure limiting aperture;

UNITED STATES PATENT AND TRADEMARK OFFICE
CERTIFICATE OF CORRECTION

PATENT NO. : 4,992,662
DATED : Feb. 12, 1991
INVENTOR(S) : Gerasimos D. Danilatos It is certified that error appears in the above-identified patent and that said Letters Patent is hereby corrected as shown below:

(e) sample platform means, disposed outside the vacuum envelope, for maintaining a sample in registration with the pressure limiting aperture such that a surface of the sample is exposed to an electron beam emitted from the electron beam source and directed through the pressure limiting aperture so as to cause a plurality of signals of different character to be emitted from the sample;

(f) gas containment means for maintaining the sample platform means enveloped in a gaseous medium so as to allow said plurality of signals of different character emitted from the sample located on the sample platform means and exposed to an electron beam emitted from the electron beam source to come into contact with gas molecules of the gaseous medium and cause the signal-gas interaction to produce a plurality of products; and

UNITED STATES PATENT AND TRADEMARK OFFICE
CERTIFICATE OF CORRECTION

PATENT NO. : 4,992,662
DATED : Feb. 12, 1991
INVENTOR(S) : Gerasimos D. Danilatos It is certified that error appears in the above-identified patent and that said Letters Patent is hereby corrected as shown below:

(g) said gaseous medium providing for a detector means for the detection of the plurality of signals of different character emitted from the surface of the sample to produce image signals.

2. A device of claim 1 wherein the gaseous medium comprises a single gas.

3. A device of claim 1 wherein the gaseous medium comprises a mixture of gases.

4. A device of claim 1 wherein the gaseous medium comprises a mixture of nitrogen.

5. A device of claim 1 wherein the gaseous medium comprises a mixture of helium.

6. The scanning electron microscope of claim 1 wherein one of the signals emitted from the surface of the sample is photons.

UNITED STATES PATENT AND TRADEMARK OFFICE
CERTIFICATE OF CORRECTION

PATENT NO. : 4,992,662
DATED : Feb.12, 1991
INVENTOR(S) : Gerasimos D. Danilatos It is certified that error appears in the above-identified patent and that said Letters Patent is hereby corrected as shown below:

7. A device of claim 6 wherein said gaseous medium is such that the wavelength of the photons is within the range from about $1 \times 10^{-11}$ meters to about $4 \times 10^{-8}$ meters.

8. A device of claim 7 wherein the detection means is a scintillation counter.

9. A device of claim 7 wherein the detection means is a lithium drifted silicon detector.

10. A device of claim 6 wherein said gaseous medium is such that the wavelength of the photons is within the range from about $4 \times 10^{-18}$ meters to about $7 \times 10^{-7}$ meters.

11. A device of claim 10 wherein the detection means is a photomultiplier tube.

12. A device of claim 10 wherein the detection means is a photodiode.

13. A device of claim 6 wherein said gaseous medium is such that the wavelength of the photons is within the range from about $7 \times 10^{-7}$ meters to about $2 \times 10^{-4}$ meters.

UNITED STATES PATENT AND TRADEMARK OFFICE
CERTIFICATE OF CORRECTION

PATENT NO. : 4,992,662
DATED : Feb. 12, 1991
INVENTOR(S) : Gerasimos D. Danilatos It is certified that error appears in the above-identified patent and that said Letters Patent is hereby corrected as shown below:

14. A device of claim 13 wherein the detection means is a photomultiplier tube.

15. A device of claim 13 wherein the detection means is a photodiode.

16. A method for microscopically imaging the surface of a sample which comprises:

(a) surrounding the sample with gas molecules;

(b) scanning the surface of the sample with an electron beam having sufficient energy so as to cause a plurality of signals of different character to be emitted from the surface of the sample;

(c) interacting said plurality of signals of different character with gas molecules to produce a plurality of products;

UNITED STATES PATENT AND TRADEMARK OFFICE
CERTIFICATE OF CORRECTION

PATENT NO. : 4,992,662
DATED : Feb. 12, 1991
INVENTOR(S) : Gerasimos D. Danilatos It is certified that error appears in the above-identified patent and that said Letters Patent is hereby corrected as shown below:

(d) utilizing the gas molecules to detect said plurality of signals of different character emitted from the surface of the sample; and (e) forming images of the sample based on the signals detected.

21. The method of microscopically imaging the surface of a sample of claim 16 wherein one of the signals emitted from the surface of the sample is photons.

Signed and Sealed this

Twenty-second Day of June, 1993

Attest:

MICHAEL K. KIRK

*Attesting Officer*     Acting Commissioner of Patents and Trademarks